US007013960B2

(12) United States Patent
Lee et al.

(10) Patent No.: US 7,013,960 B2
(45) Date of Patent: Mar. 21, 2006

(54) HEAT DISSIPATION DEVICE

(75) Inventors: Hsieh-Kun Lee, Tu-Cheng (TW);
Wan-Lin Xia, Shenzhen (CN); Tao Li,
Shenzhen (CN); Bo-Yong Yang,
Shenzhen (CN)

(73) Assignee: Hon Hai Precision Industry Co., Ltd.,
(TW)

( * ) Notice: Subject to any disclaimer, the term of this patent is extended or adjusted under 35 U.S.C. 154(b) by 0 days.

(21) Appl. No.: 10/955,286

(22) Filed: Sep. 30, 2004

(65) Prior Publication Data
US 2005/0241808 A1 Nov. 3, 2005

(30) Foreign Application Priority Data
Apr. 29, 2004 (CN) .................... 2004200454805

(51) Int. Cl.
*F28D 15/00* (2006.01)
(52) U.S. Cl. .................... 165/104.33; 165/104.21; 165/80.3; 361/697; 361/700; 257/715; 174/15.2
(58) Field of Classification Search .......... 165/104.33, 165/104.21, 80.3, 80.4; 361/697, 699, 704; 257/714–716; 174/15.2
See application file for complete search history.

(56) References Cited

U.S. PATENT DOCUMENTS

| 5,042,257 | A | * | 8/1991 | Kendrick et al. ............ 62/3.1 |
| 5,682,948 | A | * | 11/1997 | Bock ........................ 165/185 |
| 5,829,514 | A | * | 11/1998 | Smith et al. ................. 165/78 |
| 6,050,332 | A | * | 4/2000 | Smith et al. ............... 165/185 |
| 6,138,352 | A | * | 10/2000 | Smith et al. ............. 29/890.03 |
| 6,189,601 | B1 | * | 2/2001 | Goodman et al. .......... 165/80.3 |
| 6,279,648 | B1 | * | 8/2001 | Diels et al. ................ 165/80.3 |
| 6,396,693 | B1 | * | 5/2002 | Shih ........................... 361/703 |
| 6,651,734 | B1 | * | 11/2003 | Liu ............................ 165/80.3 |
| 6,671,957 | B1 | * | 1/2004 | Diels ..................... 29/890.03 |
| 6,918,429 | B1 | * | 7/2005 | Lin et al. .................... 165/80.3 |
| 2003/0019610 | A1 | * | 1/2003 | Liu ............................ 165/80.3 |
| 2004/0226697 | A1 | * | 11/2004 | Liu ......................... 165/104.33 |

FOREIGN PATENT DOCUMENTS

| TW | 526960 | 4/2003 |
| TW | 539397 | 6/2003 |

* cited by examiner

*Primary Examiner*—Terrell McKinnon
(74) *Attorney, Agent, or Firm*—Morris Manning & Martin; Tim Tingkang Xia, Esq.

(57) ABSTRACT

A heat dissipation device includes a first heat sink (10), a second heat sink (20) and at least one heat pipe (30). The first heat sink includes a first base (12) and a plurality of fins (14). The second heat sink includes a second base (22) and a plurality of fins (24). The second heat sink is located above and faced to the first heat sink. At least one fin (15) of the first heat sink forms a bifurcated portion (152) at an upper section thereof. A corresponding fin (25) of the second heat sink is fixed to the bifurcated portion of the bifurcated fin via soldering process. The heat pipe interconnects the first base and the second base.

20 Claims, 4 Drawing Sheets

HEAT DISSIPATION DEVICE

TECHNICAL FIELD

The present invention relates generally to a heat dissipation device, and more particularly to a heat dissipation device using heat pipes for removing heat from heat-generating components.

BACKGROUND

Electronic devices such as central processing units (CPUs) of computers generate large amounts of heat during their normal operations. The heat must be quickly removed to keep the CPUs working within their normal temperature ranges. Typically, heat dissipation devices such as heat sinks are provided to the CPUs for heat dissipation.

Conventional heat sinks such as aluminum extrusion type heat sinks are widely used for heat dissipation of electronic devices. The extrusion heat sink is integrally formed which generally includes a heat sink base and a plurality of cooling fins extending from the base for increasing the heat dissipating surface area of the heat sink. However, due to limitations of molding and extrusion technology, the height of fins of an extrusion heat sink is limited and the spaces between adjacent fins cannot be made as desirably narrow. The density of the heat sink is therefore limited, which greatly limits the heat dissipating surface area of the heat sink.

To solve the aforesaid drawback of aluminum extrusion type heat sink, another kind of heat sink having a plurality of cooling fins which are manufactured independently and then assembled has been developed. The assembled cooling fins are then soldered to a heat sink base. This kind of combined heat sink provides a higher fin density and a larger heat dissipating surface area. However, the soldering process renders unduly thermal resistance existing between the cooling fins and the base, which decreases the cooling efficiency of the combined heat sink.

SUMMARY OF THE INVENTION

Accordingly, an object of the present invention is to provide a heat dissipation device which has a large heat dissipating surface area and a high cooling efficiency.

In order to achieve the object set out above, a heat dissipation device according to the present invention comprises a first heat sink, a second heat sink and at least one heat pipe. The first heat sink includes a first base and a plurality of fins extending therefrom. The second heat sink includes a second base and a plurality of fins extending therefrom. The first and second heat sinks stack together face to face. At least one fin of the first heat sink forms a bifurcated portion at an upper section thereof. A corresponding fin of the second heat sink is attached to the bifurcated portion of said fin. The heat pipe interconnects the first base and the second base.

Other objects, advantages and novel feature of the present invention will become more apparent from the following detailed description when taken in conjunction with the accompanying drawings, in which:

DETAILED DESCRIPTION OF PREFERRED EMBODIMENTS

Figure 1:
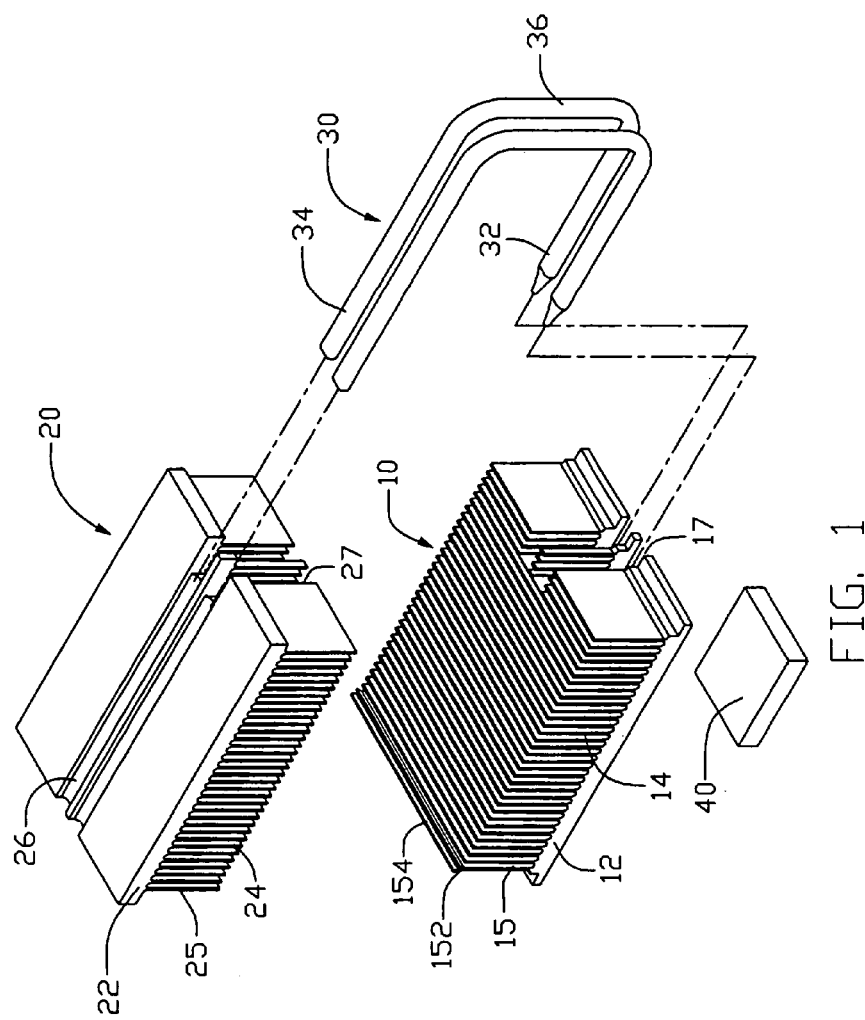
FIG. 1 is an exploded, isometric view illustrating a heat dissipation device according to an embodiment of the present invention.

Reference will now be made to the drawing figures to describe the present invention in detail.

FIG. 1 illustrates a heat dissipation device according to an embodiment of the present invention. The heat dissipation device includes first and second extrusion type heat sinks 10, 20, two heat pipes 30 and a heat receiver 40.

The first heat sink 10 is integrally formed, which includes a first base 12 and a plurality of fins 14 extending upwardly from an upper surface of the base 12. The fins 14 are arranged on the base 12 along a longitudinal direction of the base 12 and each of the fins 14 extends along a lateral direction perpendicular to the longitudinal direction. The base 12 defines a pair of first channels 16 (shown in FIG. 3) at a bottom surface thereof along the longitudinal direction. An outmost fin 15 located at one end of the heat sink 10 in the longitudinal direction bifurcates at an upper section thereof to form a substantially Y-shaped bifurcated portion 152. The bifurcated portion 152 defines a slot 154 therein along the lateral direction of the base 12. Two cutouts 17 are defined at the opposite end of the first heat sink 10 by cutting portions of the fins 14 and the base 12.

The second heat sink 20 is located above and faced to the first heat sink 10. The second heat sink 20 includes a second base 22 and a plurality of fins 24 extending downwardly from a lower surface of the base 22. A pair of second channels 26 is defined at an upper surface of the base 22 along the longitudinal direction of the base 12. Two cutouts 27 are defined at one end of the second heat sink 20, corresponding to the cutouts 17 of the first heat sink 10.

Each of the two heat pipes 30 is substantially U-shaped, including a first end 32, a second end 34 and a middle portion 36. The first end 32 of the heat pipe 30 is parallel to the second end 34 and is connected to the second end 34 via the middle portion 36.

The heat receiver 40 is a solid, rectangular block made from high thermal conductivity materials such as copper or aluminum.

Figure 2:
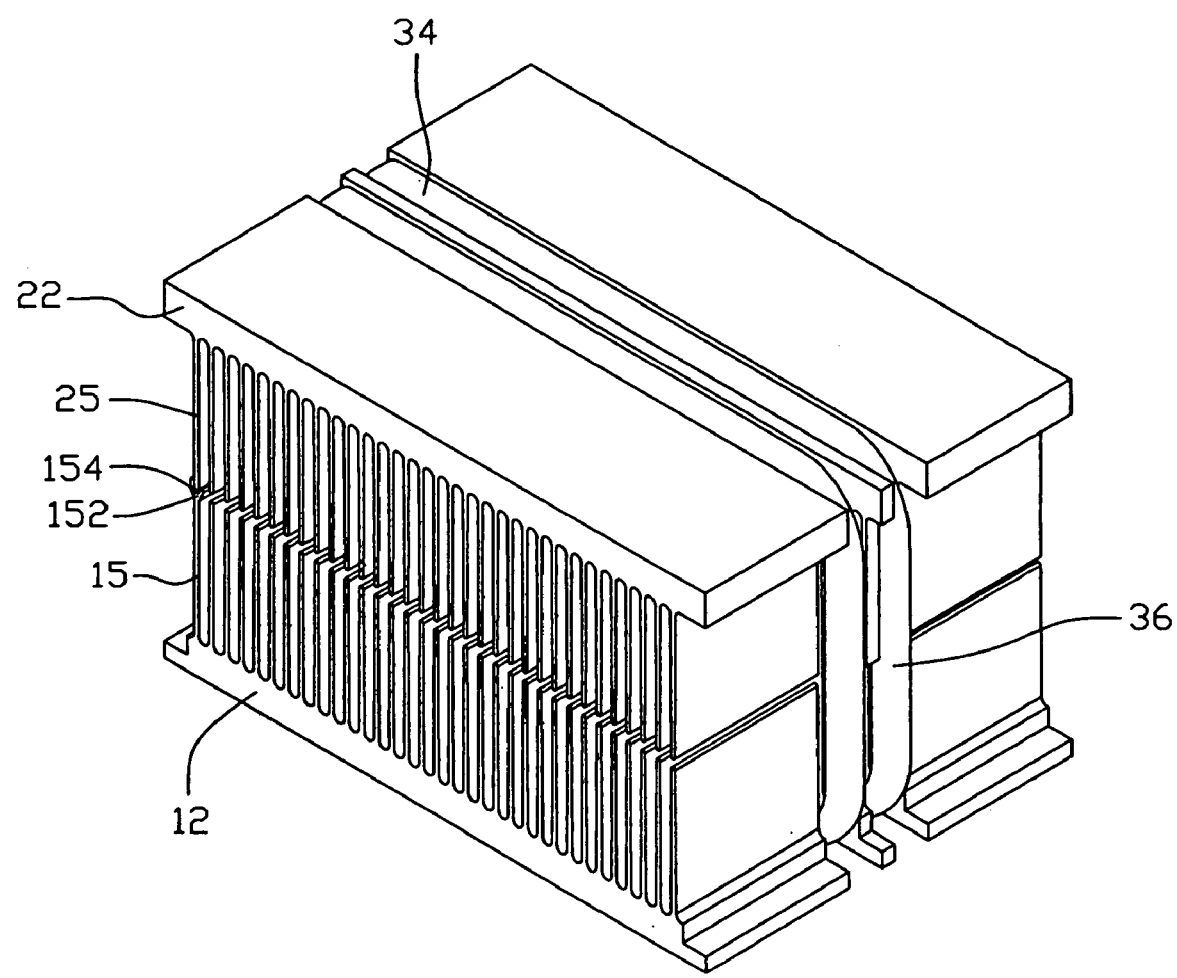
FIG. 2 is an assembled view of FIG. 1.
Figure 3:
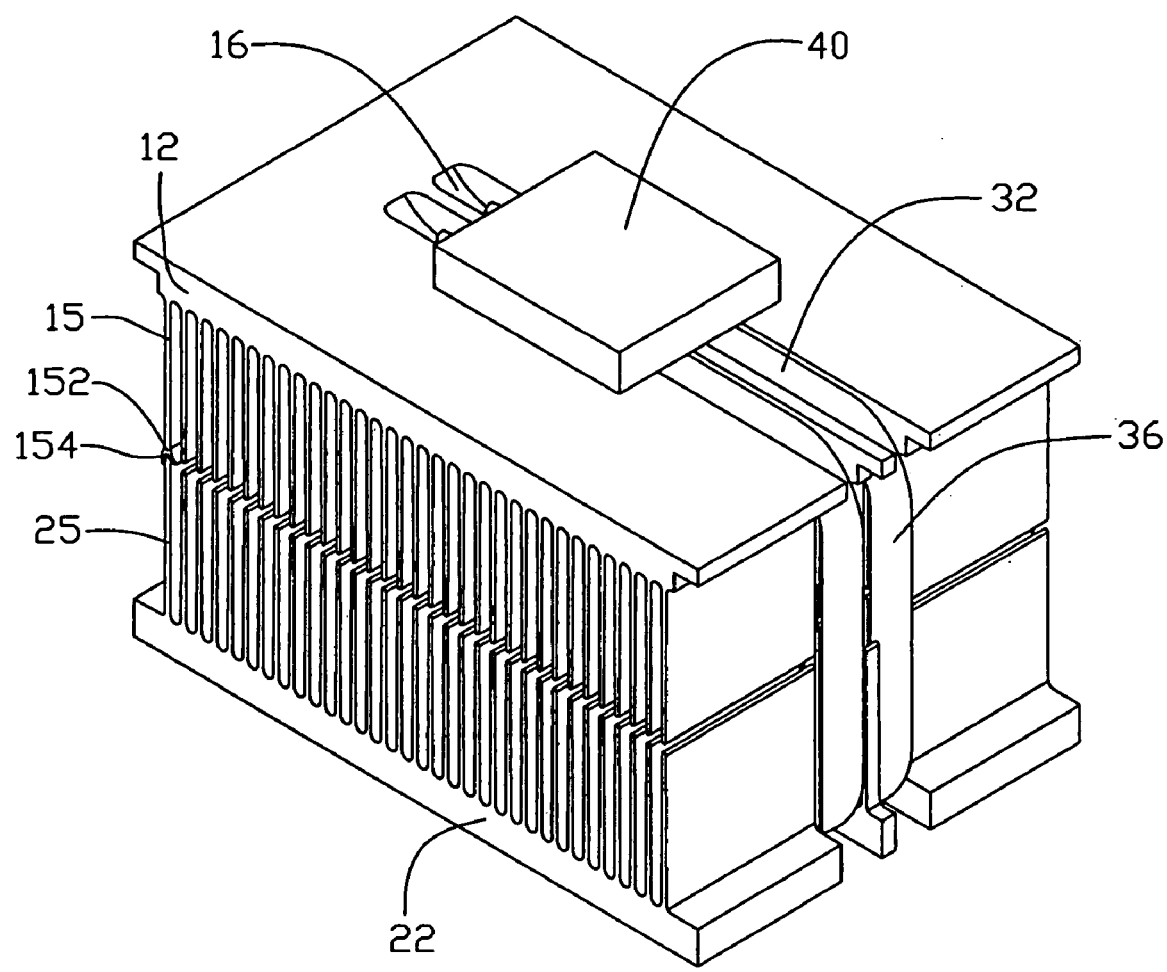
FIG. 3 is another view of FIG. 2, showing in an inverted position.

Referring also to FIG. 2 and FIG. 3, in assembly, the first and second heat sinks 10, 20 are faced with each other. Soldering material (not shown) such as tin, is predeterminedly distributed in the slot 154 of the bifurcated fin 15 and in the channels 16, 26 of the first and second bases 12, 22. An outmost fin 25 of the second heat sink 20 is located above the outmost bifurcated fin 15 of the first heat sink 10. The second heat sink 20 is moved downwardly toward the first heat sink 10 until the lowermost portion of the fin 25 is received in the slot 154 of the bifurcated fin 15. Each of the heat pipes 30 is attached to the first and second heat sinks 10, 20 by moving the heat pipe 30 toward the first and second heat sinks 10, 20 along the longitudinal direction of the base 12, until the first end 32 thereof is received in one of the first pair of channels 16 of the first heat sink 10, the second end 34 is received in one of the second pair of channels 26 of the second heat sink 20 and the middle portion 36 is received in one group of cutouts 17, 27 of the first and second heat sinks 10, 20. The heat receiver 40 is attached to the bottom surface of the base 12 to contact the first ends 32 of the heat pipes 30. Then, the fin 25 of the second heat sink 20 is soldered to the slot 154 of the bifurcated fin 15 and the heat pipes 30 are soldered to the first and second bases 12, 22 via soldering process to thereby firmly keep the first and second heat sinks 10, 20 together. At this stage, the heat pipes 30 are completely embedded in the first and second heat sinks 10, 20, thereby obtaining a compact structure. When used, the heat receiver 40 is attached to an electronic device such as a CPU for heat absorption. The heat generated by the CPU is transferred to the first heat sink 10 via the heat receiver 40 and to the second heat sink 20 via the heat pipes 30. As a matter of fact, directly attaching the base 12 or the base 22 to the CPU is an alternative way for purposes of heat absorption.

Figure 4:
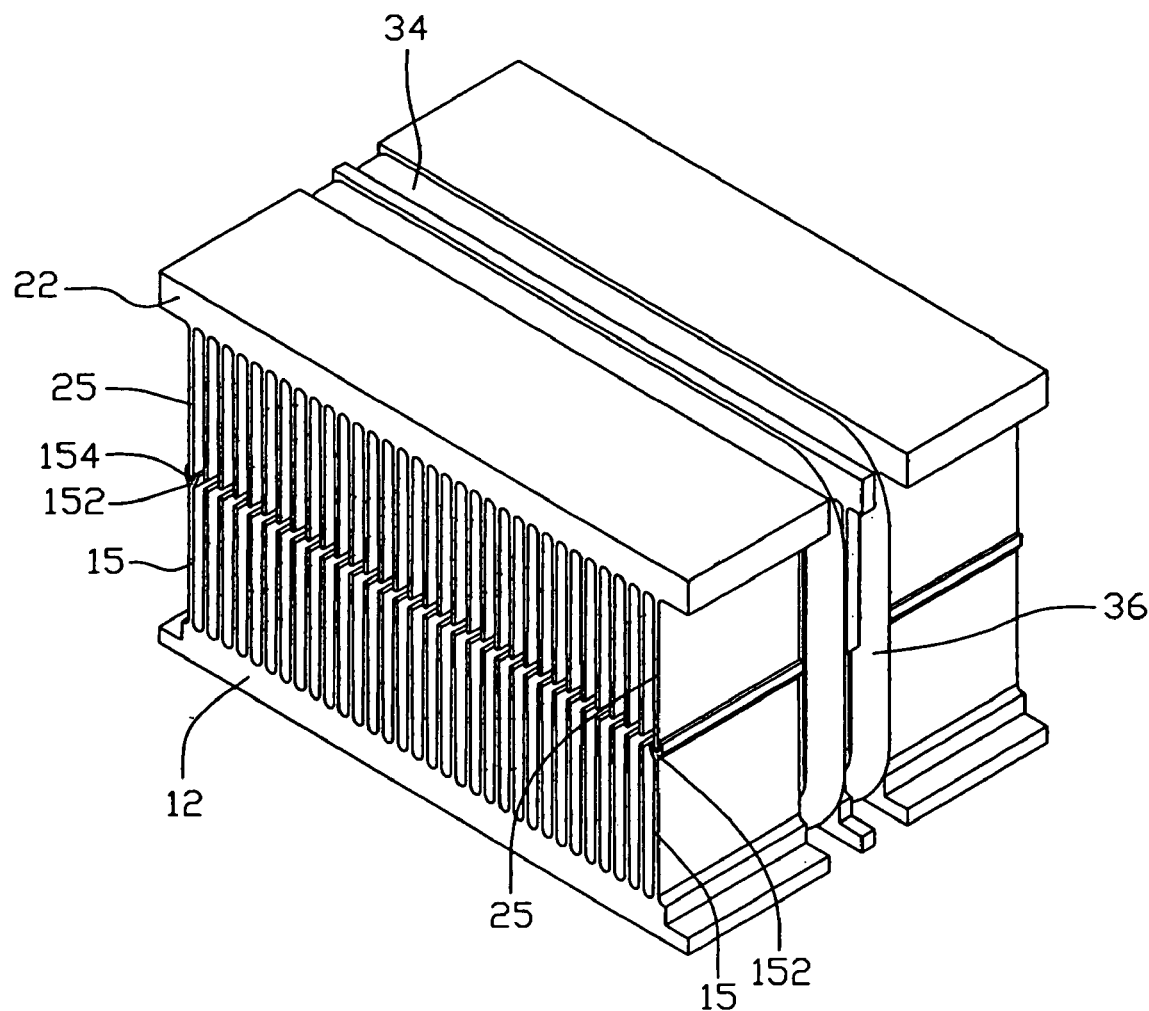
FIG. 4 is an assembled view illustrating a heat dissipation device according to another embodiment of the present invention

FIG. 4 shows another embodiment of the heat dissipation device, wherein each of the two outmost fins 15 of the first heat sink 10 forms a bifurcated portion 152 at an upper section thereof. Corresponding fins 25 of the second heat sink 20 are fixed to the bifurcated portions 152 of the bifurcated fins 15 via soldering. The other structures are the same as the first embodiment above-mentioned.

In the present invention, the heat dissipation device comprises two extrusion heat sinks 10, 20 stacked together, thereby obtaining larger heat dissipating surface area compared with a single extrusion heat sink. Each of the heat sinks 10, 20 is integrally formed by extrusion, thus eliminating unduly thermal resistance produced by soldering process involved in combined type heat sink of which the fins are independently manufactured and then assembled to the base via soldering.

The fin 25 of the second heat sink 20 is positioned and received in the slot 154 of the bifurcated fin 15 before the heat pipes 30 are attached to the first and second heat sinks 10, 20, thus preventing the second heat sink 20 from moving relative to the first heat sink 10 along the longitudinal direction of the base 12 when attaching the heat pipes 30 to the first and second heat sinks 10, 20.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat dissipation device comprising:
   a first heat sink having a first base and a plurality of fins, at least one fin of the first heat sink forming a bifurcated portion at an upper section thereof, the first base defining at least one channel communicating with ambient air in a face thereof perpendicular to the fins, the bifurcated portion having a width larger than a thickness of the at least one fin;
   a second heat sink having a second base and a plurality of fins, the second heat sink located above and faced to the first heat sink, a corresponding fin of the second heat sink fixed to said bifurcated portion via soldering process, the corresponding fin of the second heat sink having a uniform thickness throughout its whole length; and
   at least one heat pipe interconnecting said first base and said second base, the at least one heat pipe having a portion combined to the at least one channel of the first base and exposed to the ambient air at the face of the first base.

2. The heat dissipation device of claim 1, wherein the bifurcated portion is formed at an outmost fin of said first heat sink.

3. The heat dissipation device of claim 2, wherein said first heat sink forms two bifurcated portions at two outmost fins thereof respectively.

4. The heat dissipation device of claim 1, wherein the bifurcated portion defines a slot therein for receiving said corresponding fin.

5. The heat dissipation device of claim 1, wherein the second base of the second heat sink defines at least one channel communicating with ambient air at a face thereof, and wherein the at least one heat pipe further has an additional portion embedded in the channel of the second base.

6. The heat dissipation device of claim 5, wherein said at least one heat pipe is U-shaped.

7. The heat dissipation device of claim 6, wherein a middle portion of said at least one heat pipe is received in a group of cutouts defined at a respective end of said first and second heat sinks.

8. The heat dissipation device of claim 5, wherein at least one of the two portions of the at least one beat pipe is flat.

9. The heat dissipation device of claim 1, wherein a plate is attached to an outside of one of the first base and the second base.

10. A heat dissipation device comprising:
    a first heat sink including a first base and a plurality of fins arranged on the base along a first direction, each of the fins extending along a second direction substantially perpendicular to said first direction, at least one fin of the first heat sink forming a bifurcated portion at an upper section thereof, the bifurcated portion defining a slot therein along said second direction, the bifurcated portion having a width larger than a thickness of the at least one fin;
    a second heat sink including a second base and a plurality of fins extending therefrom, the second heat sink located above and faced to the first heat sink with a corresponding fin thereof being received in said slot, the corresponding fin having a uniform thickness throughout its whole length, the second base defining at least one channel communicating with ambient air at a face thereof perpendicular to the fins of the second heat sink; and
    at least one heat pipe attached to said first and second bases along said first direction, the at least one heat pine having a portion embedded in the at least channel of the second base.

11. The heat dissipation device of claim 10, wherein said corresponding fin of said second heat sink is soldered to the first heat sink at said slot.

12. The heat dissipation device of claim 10, wherein the bifurcated portion is formed at an outmost fin of said first heat sink.

13. The heat dissipation device of claim 12, wherein the bifurcated portion is formed at each of two outmost fins of said first heat sink.

14. The heat dissipation device of claim 10, wherein said at least one heat pipe is U-shaped and further has an additional portion embedded in a channel defined in the first base of the first heat sink, and wherein the portion of the at least one heat pipe is exposed to ambient air.

15. The heat dissipation device of claim 14, wherein a middle portion of said at least one heat pipe is received in a group of cutouts defined at a respective end of said first and second heat sinks to render said at least one heat pipe completely being embedded in said first and second heat sinks.

16. The heat dissipation device of claim 10, wherein each of said first and second heat sinks is integrally formed.

17. The heat dissipation device of claim 14, wherein at least one of the two portions of the at least one heat pipe is flat.

18. The heat dissipation device of claim 10, wherein a plate is attached to an outside of one of the first base and the second base.

19. A heat dissipation device comprising:
a first heat sink including a first base and a plurality of first fins extending from said first base;
a second heat sink including a second base and a plurality of second fins extending from said second base, at least one of said second fins supportively engaging with corresponding one of said first fins so as to support said second heat sink located next to said first heat sink; and
at least one heat pipe having two portions attached to said first and second bases respectively, said two portions exposed to ambient air at faces perpendicular to the fins of the first and second heat sinks respectively.

20. The heat dissipation device of claim 19, wherein said one of said first fins has a bifurcated portion to supportively receive a distal end of said at least one of said second fins, the bifurcated portion having a width larger than a thickness of said one of the said first fins, and said at least on of said second fins has a uniform thickness throughout its whole length.

* * * * *